United States Patent [19]
Sekiguchi

[11] Patent Number: 5,200,923
[45] Date of Patent: Apr. 6, 1993

[54] NON-VOLATILE MEMORY DEVICE

[75] Inventor: Kouji Sekiguchi, Kawasaki, Japan

[73] Assignee: Kabushiki Kaisha Toshiba, Kawasaki, Japan

[21] Appl. No.: 601,919

[22] Filed: Oct. 22, 1990

[30] Foreign Application Priority Data

Oct. 20, 1989 [JP] Japan .................................. 1-273479

[51] Int. Cl.⁵ .............................................. G11C 7/00
[52] U.S. Cl. ...................................... 365/201; 365/185; 365/210; 365/189.01
[58] Field of Search ................... 365/189.01, 201, 210, 365/189.09, 189.07, 185

[56] References Cited

U.S. PATENT DOCUMENTS 5,091,884 2/1992 Kagami ............................ 365/200

Primary Examiner—Joseph A. Popek
Attorney, Agent, or Firm—Foley & Lardner

[57] ABSTRACT

A non-volatile memory device includes a memory cell array composed of transistor memory cells, a monitor cell array composed of two transistor monitor cells, a first circuit for writing "0" and then "1" in the first monitor cell and a data "1" and then "0" in the second monitor cell, whenever a data is written in one of the memory cells. A second circuit is for applying to the first monitor cell a voltage, $V_{th1}$, which is higher than $V_{th3}$ applied to the memory cells, and for applying a voltage, $V_{th2}$, which is lower than $V_{th3}$, to the second monitor cell, in response to a test mode signal, whenever a data is read from the memory cells. A third circuit is for discriminating a margin in the number of data writable operations of the memory cell by detecting monitor cell deterioration. This is accomplished on the basis of the on-off status of the two monitor cells when the second circuit applies $V_{th1}$ and $V_{th2}$ to the two monitor cells. Therefore, a margin of the memory cells can automatically be indirectly checked by checking a margin of the monitor cells activated under more strict conditions (e.g. the number of operations, threshold voltage, supply voltage, etc.), as compared with the memory cells.

4 Claims, 7 Drawing Sheets

NON-VOLATILE MEMORY DEVICE

BACKGROUND OF THE INVENTION

The present invention relates to a non-volatile memory device, and more specifically to an electrically erasable programmable read-only memory (EEPROM).

A conventional non-volatile memory includes in general, a timing controller, a step-up circuit, an address buffer, a row decoder, a column decoder, a read/write controller, a memory cell array composed of a plurality of transistors each having a floating gate and arranged into an array, and an I/O buffer.

In the conventional non-volatile memory, there exists a limitation in the number of operations or activations that data can be written into each memory cell of the memory cell array (referred to as endurance, hereinafter). This is because the insulating film and the floating gate of each memory cell transistor deteriorate, due to the tunnel effect, such that electrons are injected into or emitted from the floating gate of the transistor through the insulating film. Therefore, as shown in FIG. 8, a difference in threshold voltage between a curve $g_1$ representative of the logical "1" side and a curve $g_2$ representative of the logical "0" side decreases with increasing endurance, so that the threshold voltage margins $h_1$ and $h_0$ on both sides are reduced, respectively. As a result, it has been necessary to prevent erroneous data reading operation by previously determining a limitation of the endurance (e.g. $10^4$ times).

Accordingly, in the conventional non-volatile memory, care must be taken so that the number of operations that data can be written will not exceed a predetermined limit or a guaranteed range. Especially, in such a system configuration that data are often rewritten at one part of the memory cells, even if the other part of the memory cells lies within the guaranteed range or if erroneous operation does not at all occur in practice, whenever the memory cells at which data are concentratively often rewritten reach the number of predetermined guaranteed operations, it has been necessary to replace the old non-volatile memory with a new one, or to change data writing operation via an external controller, so that data may be concentrically rewritten to different memory cells.

SUMMARY OF THE INVENTION

With these problems in mind, therefore, it is the object of the present invention to provide a non-volatile memory device which can automatically detect the margin in practical operation, without checking the number of data writing operations or activations.

To achieve the above-mentioned object, the present invention provides a non-volatile memory device comprising:

(a) memory cell array having a plurality of transistor memory cells arranged into array, data being written in and erasable from each memory cell by applying predetermined voltages to a control gate and a drain thereof, respectively and by further injecting and extracting electrons to and from a floating gate thereof;

(b) a monitor cell array having first and second monitor cells provided with the same characteristics as those of the memory cells;

(c) first means for writing a data "0" and then a data "1" in the first monitor cell and a data "1" and then a data "0" in the second monitor cell of said monitor cell array, whenever a data is written in either one of the memory cells of said memory cell array;

(d) second means for applying a voltage $V_{th1}$ higher than a threshold sense level voltage $V_{th3}$ applied to the control gates of the memory cells to a control gate of the first monitor cell of said monitor cell array and a voltage $V_{th2}$ lower than the threshold sense level voltage $V_{th3}$ to a control gate of the second monitor cell of said monitor cell array, in response to a test mode signal inputted from outside whenever a data is read from said memory cells; and (e) third means for discriminating whether there exists a margin in the number of data writable operations of the memory cells by detecting an occurrence of monitor cell deterioration on the basis of on- or off-status of the first and second monitor cells, when said second means applies the voltages $V_{th1}$ and $V_{th2}$ to the control gates of the first and second monitor cells of said monitor cell array, respectively.

In the non-volatile memory device according to the present invention, whenever a data ("0" or "1") is written in a memory cell, the first means writes "0" and then "1" in the first monitor cell and further "1" and then "0" in the second monitor cell. This allows the monitor cells to be deteriorated earlier than the memory cells. Further, in response to a test mode signal, the second means applies a voltage $V_{th1}$ present higher than a threshold sense level $V_{th3}$ applied to the memory cells, to a control gate of the first monitor cell and a voltage $V_{th2}$ present lower than the threshold sense level $V_{th3}$, to a control gate of the second monitor cell. When these voltages $V_{th1}$ and $V_{th2}$ are applied to the first and second monitor cells, respectively, the third means discriminates the presence of a margin of the number of data-writing operations in the monitor cells on the basis of on- or off-status of the first and second monitor cells. Therefore, the presence of a margin of the number of data writing operations in the memory array cells can be discriminated on the basis of the margin of the monitor cells. In other words, it is possible to automatically determine the presence of a margin of the number of writing operations in the memory array cells by use of the monitor cells.

DETAILED DESCRIPTION OF THE PREFERRED EMBODIMENTS

Figure 1:
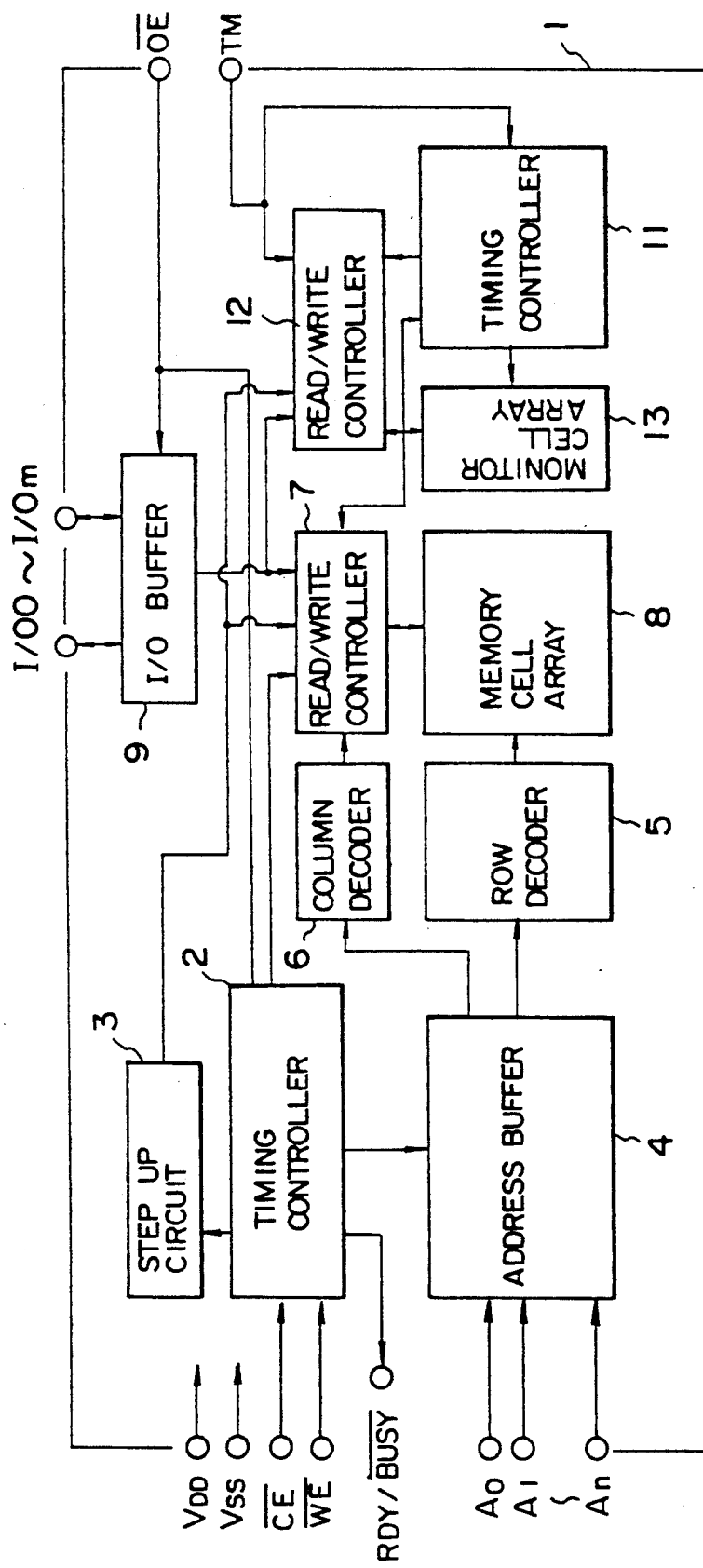
FIG. 1 is a block diagram showing a configuration of an embodiment of the non-volatile memory device according to the present invention.

FIG. 1 shows an embodiment of the non-volatile memory device according to the present invention. In the drawing, the non-volatile memory device 1 comprises a timing controller 2, a stepup circuit 3, an address buffer 4, a row decoder 5, a column decoder 6, a read/write controller 7, a memory cell array 8 composed of a plurality of transistors each having a floating gate and arranged into array, an I/O buffer 9, a timing controller 11, a read/write controller 12, and a monitor cell array 13.

The timing controller 2 transmits control signals to the setup circuit 3, the address buffer 4 and the read/write controller 7 on the basis of control signals $\overline{CE}$ (Chip Enable), and $\overline{WE}$ (Write Enable) and $\overline{OE}$ (Output Enable) which are externally provided, and further outputs a control signal RDY (Ready)/BUSY. In response to the control signals from the timing controller 2, the setup circuit 3 generates a high voltage required to write and erase data to and from the memory cells in the memory cell array 8. In response to the control signal from the timing controller 2, the address buffer 4 distributes address signals $A_0, A_1, \ldots A_n$ to the row decoder 5 and the column decoder 6. The row decoder 5 and the column decoder 6 designate a row and a column of the memory cell array 8, respectively.

In response to the control signal from the timing controller 2, the read/write controller 7 reads and writes data from and to a memory cell designated by the row decoder 5 and the column decoder 6. The read data are outputted to outside via the I/O buffer 9 only when the control signal OE is in enable status.

Figure 3:
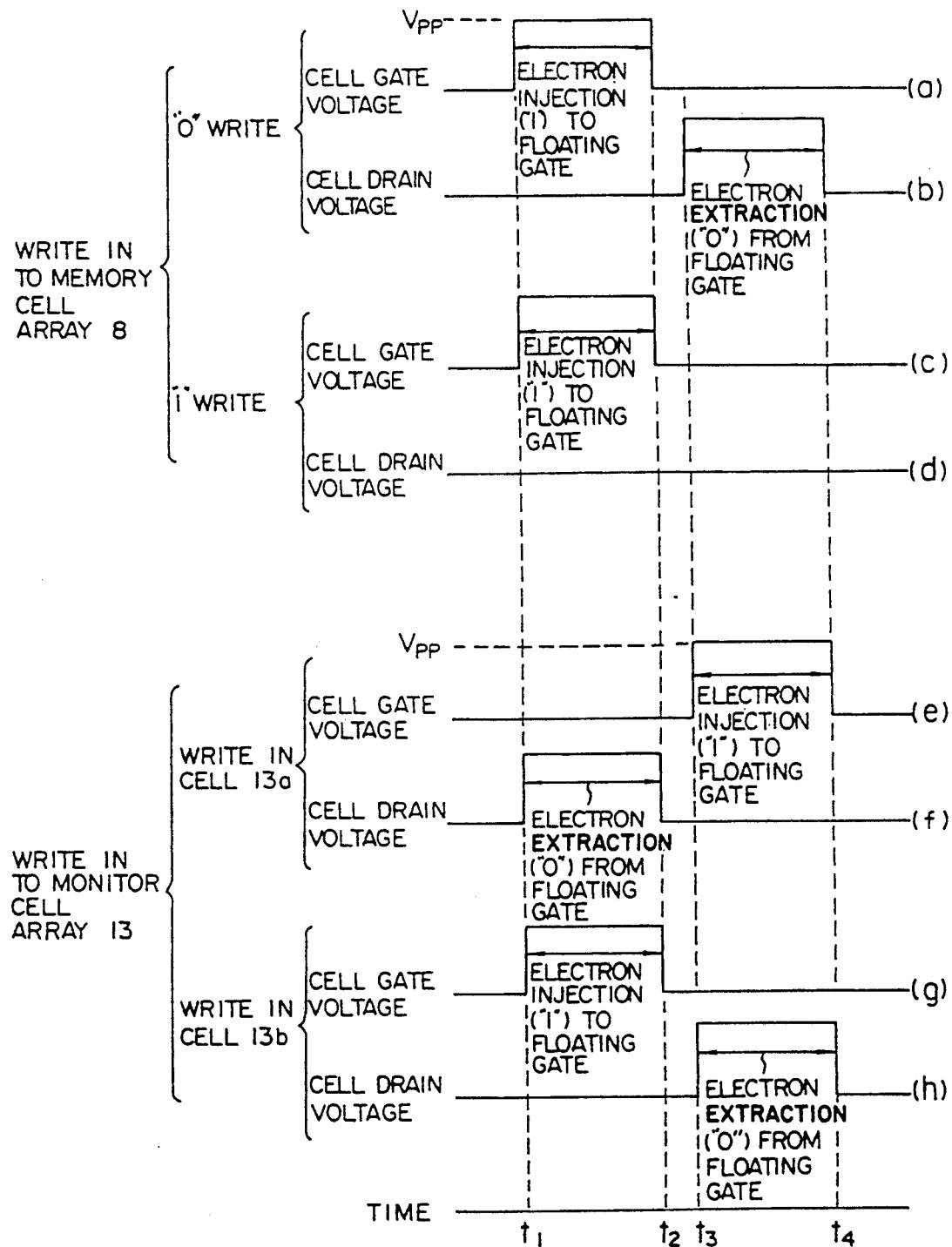
FIG. 3 is a timing chart for assistance in explaining the writing operation to the monitor cells.
Figure 4:
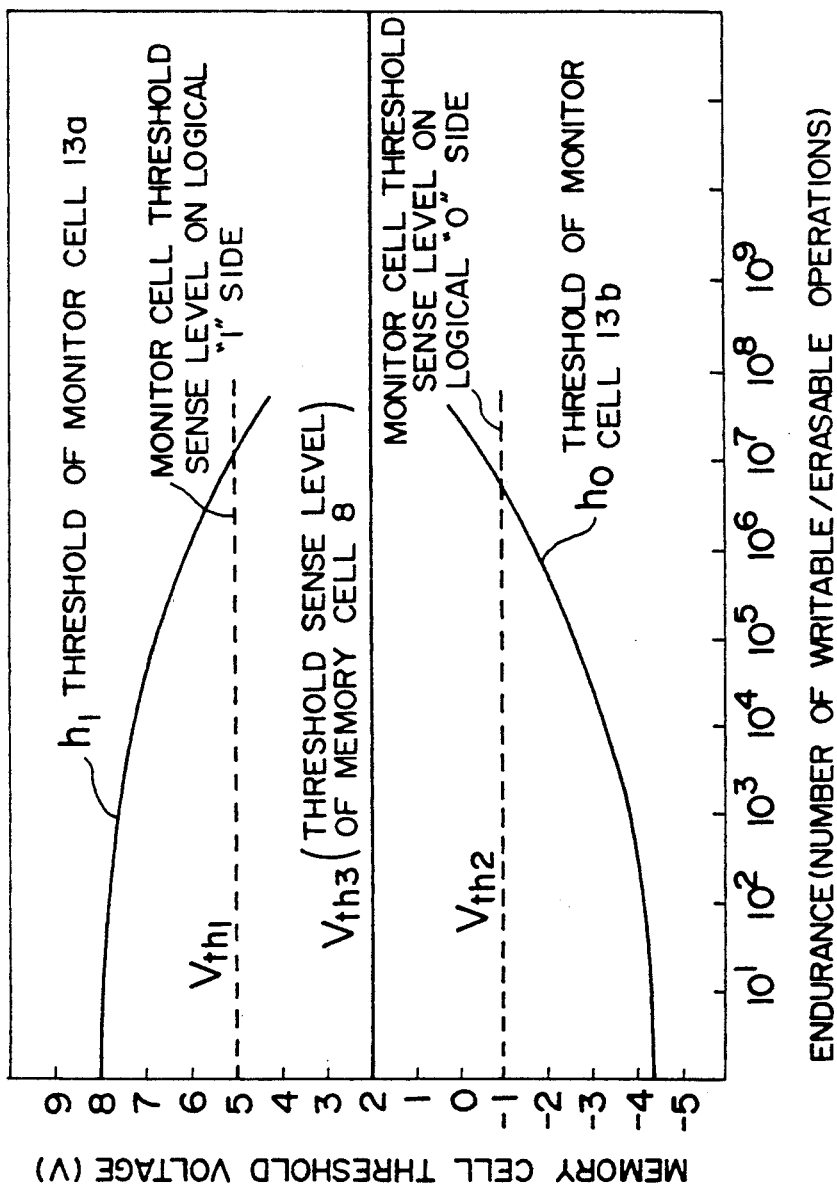
FIG. 4 is a graphical representation showing the relationship between the threshold sense level of the monitor cell and that of the memory cells.

The configuration and the operation of each of the timing controller 11, the read/write controller 12 and the monitor cell array 13 will be described hereinbelow with reference to FIGS. 2, 3 and 4.

Figure 2:
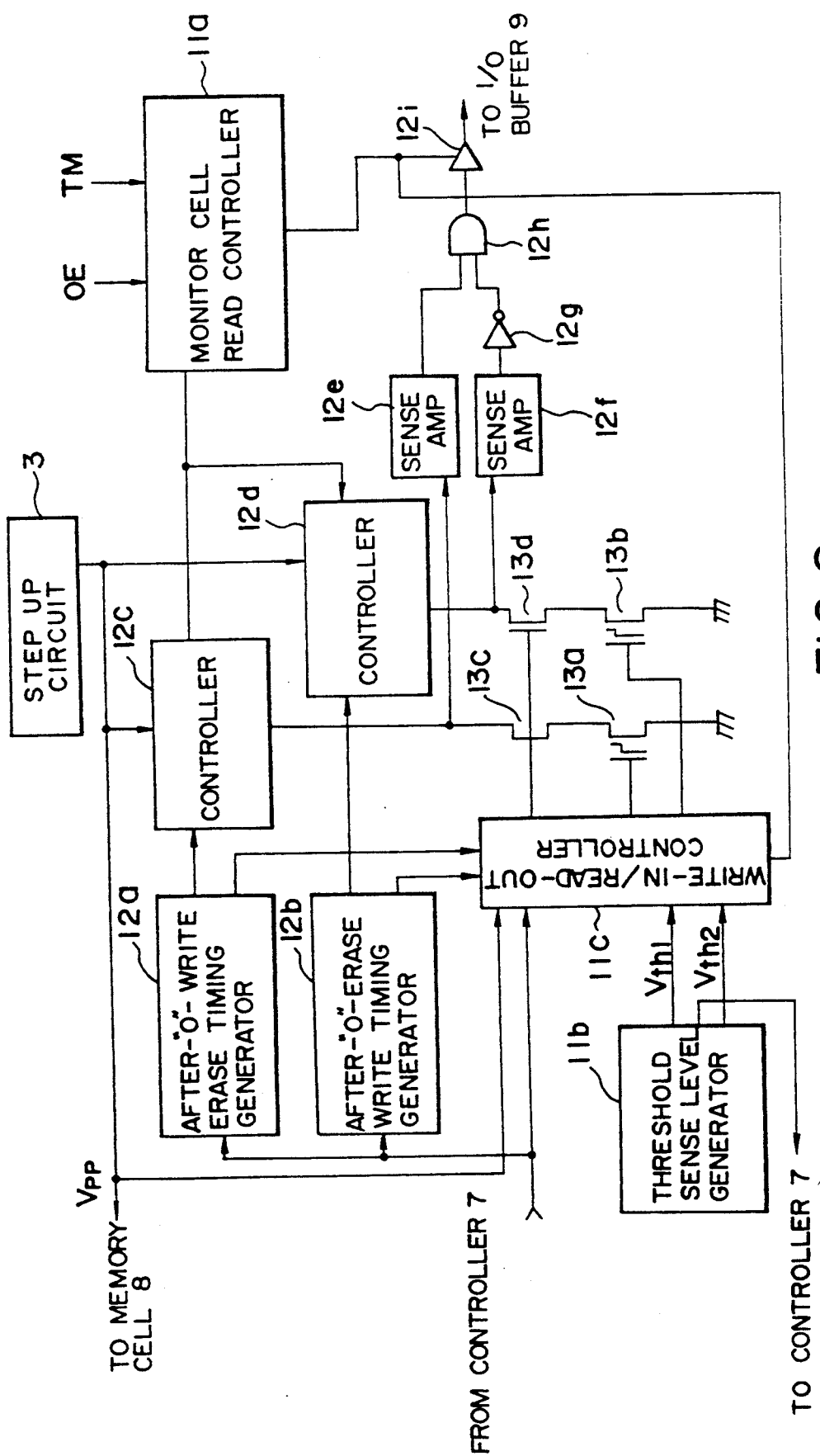
FIG. 2 is a block diagram showing a timing controller, a read/write controller, and a typical monitor cell array, related to the embodiment shown in FIG. 1.

In FIG. 2, the timing controller 11 includes a monitor cell read-out controller 11a, a threshold sense level generator 11b, and a write in/read-out controller 11c. The read/write controller 12 is composed of an after—"0"—write erase timing generator (referred to as timing generator, hereinafter) 12a, an after-erase "0"—write timing generator (referred to as timing generator) 12b, two controllers 12c and 12d, two sense amplifiers 12e and 12f, an NOT gate 12g, an AND gate 12h, and a tristate output buffer (referred to as buffer) 12i.

The monitor cell array 13 is made up of two reference monitor cells 13a and 13b and two selecting transistors 13c and 13d. The monitor cell 13a is connected in series with the selecting transistor 13c for selecting the monitor cell 13a. The monitor cell 13b is connected in series with the selecting transistor 13d for selecting the monitor cell 13b. These two monitor cells 13a and 13b are so manufactured as to be provided with the same characteristics as those of the cells arranged in the memory cell array shown in FIG. 1.

Here, an assumption is made that a data "0" or "1" is to be written in a cell of the memory cell array 8. For instance, when a data "0" is written, two voltage signals as shown in FIGS. 3(a) and 3(b) are applied to the gate and the drain of each cell to which "0" is written. In more detail, a high voltage signal $V_{PP}$ (e.g. about 20 V) is applied to the cell gate from time $t_1$ to time $t_2$ and to the cell drain from $t_3$ ($2t_2$) to $t_4$. Further, when a data "1" is written, two voltage signals as shown in FIG. 3(c) and (d) are applied to the gate and the drain of each cell.

Immediately before the above-mentioned write operation, a signal indicative of write-operation is transmitted from the read/write controller 7 to the write-in/read-out controller 11c and the two timing generators 12a and 12b. In response to the above write-operation signal, the write-in/read-out controller 11c applies a low voltage (0 V) from $t_1$ to $t_3$ and a high voltage $V_{PP}$ from $t_3$ to $t_4$ to the gate of the monitor cell 13a as shown in FIG. 3(e), and a high voltage $V_{PP}$ from $t_1$ to $t_2$ and a low voltage from $t_2$ and after to the gate of the monitor cell 13b as shown in FIG. 3(g). Further, at the same time, the two timing generators 12a and 12b transmit control signals to the two controllers 12c and 12d, respectively. In response to these control signals, a high voltage $V_{PP}$ supplied by the setup circuit 3 is applied to each drain of the two monitor cells 13a and 13b via the two controllers 12c and 12d and the two selecting transistors 13c and 13d, respectively as shown in FIGS. 3(f) and 3(h). In more detail, to the drain of the monitor cell 13a, a high voltage $V_{PP}$ is applied from $t_1$ to $t_2$, and a low voltage is applied from $t_2$ and after. To the drain of the monitor cell 13b, a low voltage is applied from $t_1$ to $t_3$ and a high voltage $V_{PP}$ is applied from $t_3$ to $t_4$.

Accordingly, whenever a data "0" or "1" is written (writing of "1" is referred to as "erase") in one of the memory cells of the memory cell array 8, a data "0" is written in the monitor cell 13a and then a data "1" is written in the same cell 13a. Similarly, a data "1" is written in the monitor cell 13b and then a data "0" is written in the same cell 13b. Therefore, since data are written in and then erased from the monitor cells 13a and 13b whenever data are written in one of memory cells, the monitor cells 13a and 13b deteriorate earlier than the memory cells arranged in the memory cell array 8.

A method of detecting the presence or absence of deterioration of the monitor cells 13a and 13b will be described hereinbelow. To detect the deterioration of the monitor cells 13a and 13b, after the memory cells have been disabled, a test mode signal TM is inputted to the non-volatile memory device 1 from outside. In response to this test signal TM, the monitor cell read-out controller 11a transmits control signals to the controllers 12c and 12d and the write in/read-out controller 11c. In response to the control signals, the controllers 12c and 12d apply two voltage signals of about 2 V to the drains of the two monitor cells 13a and 13b, respectively via the selecting transistors 13c and 13d. At the same time, the threshold sense level generator 11b applies two threshold sense level voltages $V_{th1}$ and $V_{th2}$ to the control gates of the two monitor cells 13a and 13b, respectively via the write-in/read-out controller 11c. This threshold sense level generator 11b additionally generates a threshold sense level $V_{th3}$ applied to the memory cell control gates, when datas stored in the memory cells of the memory cell array 8 are read out. The mutual relationship between these three threshold sense levels $V_{th1}$, $V_{th2}$ and $V_{th3}$ is previously determined as shown in FIG. 4. In FIG. 4, the threshold sense levels $V_{th1}$ and $V_{th2}$ of the two monitor cells 13a and 13b are determined more strictly than $V_{th3}$ of the memory cells in the memory cell arrays 8. Under these conditions, when the threshold of the monitor cell 13a is higher than the threshold sense level $V_{th1}$ of the monitor cell 13a, the monitor cell 13a is turned off and the drain voltage (about 2 V) of the monitor cell 13a is detected by the sense amplifier 12e via the selecting transistor 13c to determine a logical "1". When the threshold of the monitor cell 13a is lower than $V_{th1}$, the monitor cell 13a is turned on and the drain voltage (0 V) of the monitor cell 13a is detected by the sense amplifier 12e via the selecting transistor 13c to determine a logical "0". On the other hand, when the threshold of the monitor cell 13b is lower than $V_{th2}$; that is, when there exists a margin in the number of data writing operations or activations, the monitor cell 13b is turned on and the drain voltage (0 V) of the monitor cell 13b is detected by the sense amplifier 12f via the selecting transistor 13d to determine a logical "0". When the threshold of the monitor cell 13b is higher than $V_{th2}$; that is, there exists no margin in the number of operations, the monitor cell 13b is turned off and the rain voltage (about 2 V) of the monitor cell 13b is detected by the sense amplifier 12f via the selecting transistor 13d to determine a logical "1".

The output of the sense amplifier 12e is directly inputted to the AND gate 12h, and the output of the sense amplifier 12f is inputted to the AND gate 12h via the NOT gate 12g. Therefore, only when there exists both the margins in the number of data writable operations or activations with respect to both the monitor cells 13a and 13b, is an operation signal output from the AND gate 12h. This operation signal is outputted to outside via the buffer 12i and the I/O buffer 9.

Figure 5:
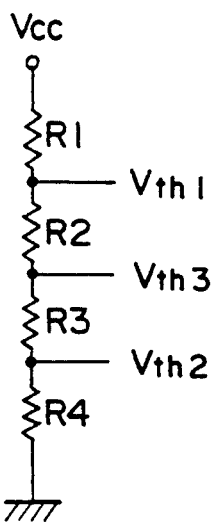
FIGS. 5 and 6 are circuit diagrams showing two examples of the threshold sense level generator, respectively.

FIG. 5 shows an exemplary circuit for generating three threshold voltages $V_{th1}$, $V_{th2}$ and $V_{th3}$, in which a voltage $V_{cc}$ is divided into three different voltages by a four series-connected resistors R1 to R4.

Further, it is more preferable to prepare a plurality of different values for each threshold voltage $V_{th1}$, $V_{th2}$ or $V_{th3}$ in order to check the degree of margin on the basis of a strict criterion at the beginning and on the basis of a non-strict criterion after the deterioration of the monitor cells has been recognized.

Figure 6:
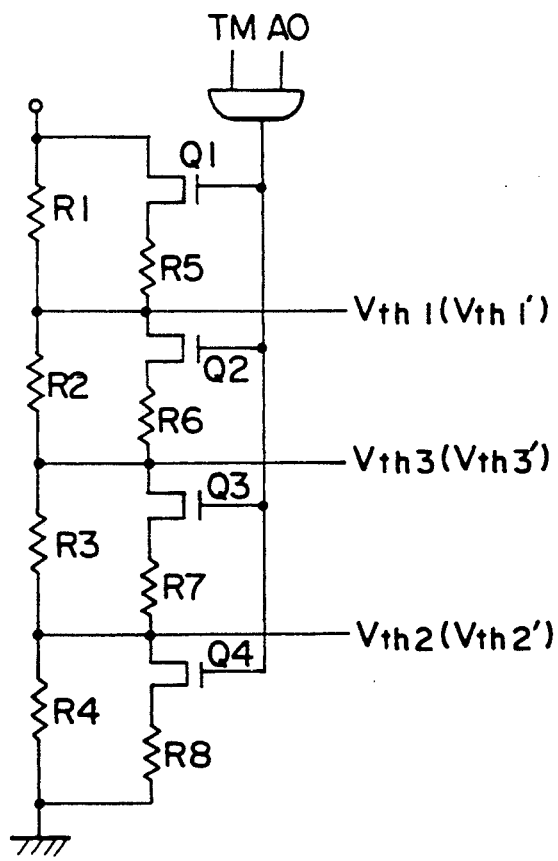

FIG. 6 shows an exemplary circuit for generating the above-mentioned threshold voltages. In this circuit, the four resistors R1 to R4 shown in FIG. 5 are each connected in parallel to four resistors R5 to R8 connected in series to four transistors Q1 to Q4, respectively. In more detail, the resistor R1 is connected in parallel to the series-connected resistor R5 and the transistor Q1, the resistor R2 is connected in parallel to the series-connected resistor R6 and the transistor Q2 and so on. These transistors Q1 to Q4 are turned on to connect the resistors R5 to R8 in parallel to the resistors R1 to R4, respectively, in response to a logical product (AND) signal of a test mode signal and an address signal. In this circuit, when the transistors Q1 to Q4 are turned on, since the resistors R5 to R8 are connected to the resistors R1 to R4, respectively, it is possible to obtain three threshold voltages $V'_{th1}$, $V'_{th2}$ and $V'_{th3}$ lower than $V_{th1}$, $V_{th2}$ and $V_{th3}$, respectively.

In the present invention, it is also possible to write/read data in or from the monitor cells under more strict conditions than described above, in order to accelerate the deterioration of the monitor cells.

Figure 7:
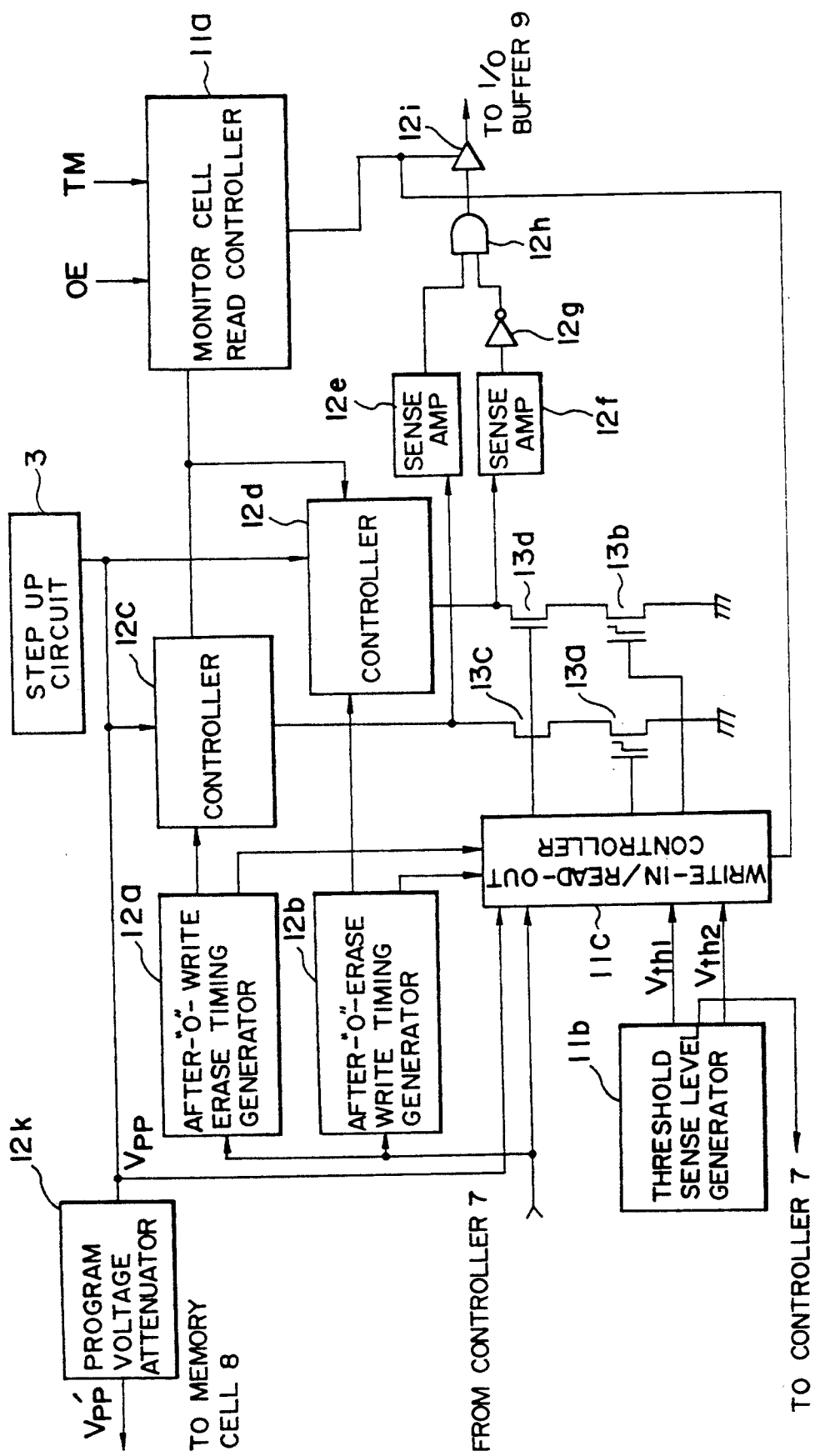
FIG. 7 is a block diagram showing another embodiment in which two different voltages are applied to the monitor cells and the memory cells.
Figure 8:
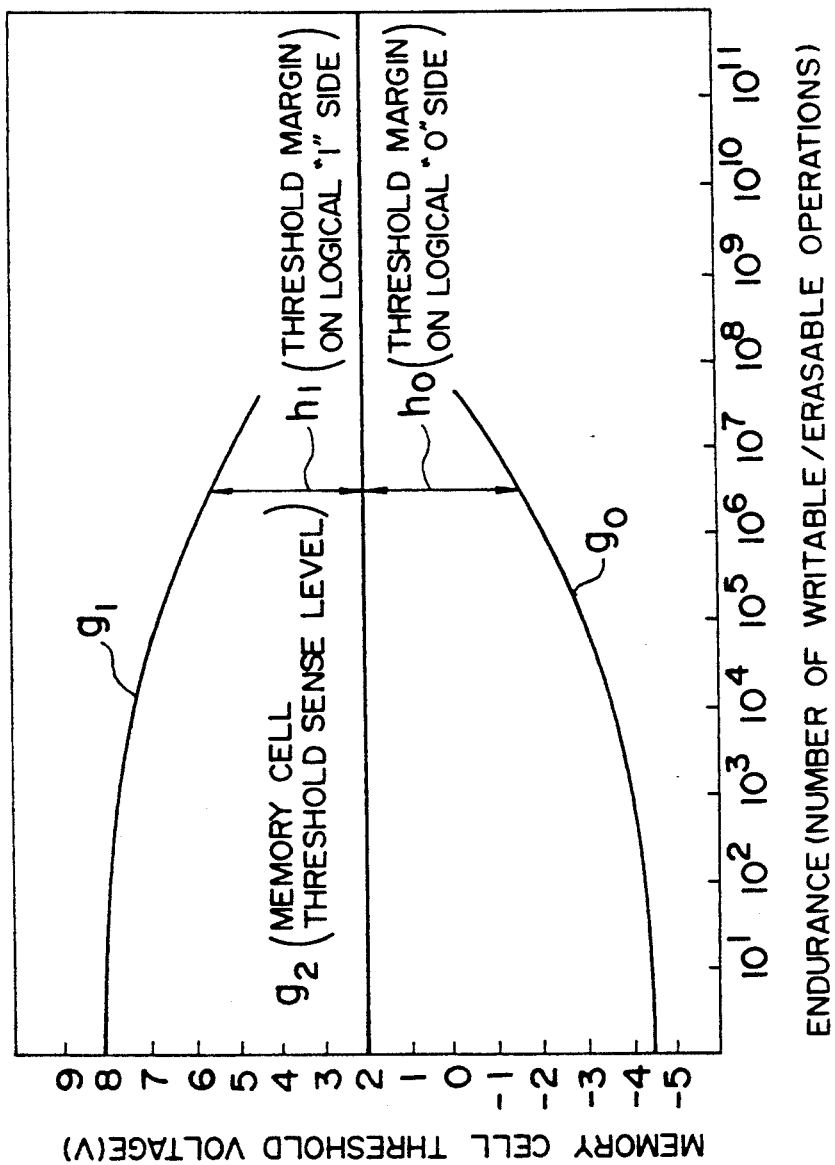
FIG. 8 is a graphical representation showing the relationship between the memory cell endurance and the memory cell threshold voltage.

FIG. 7 shows an embodiment based upon the above-mentioned concept, in which a program voltage attenuator 12k is additionally provided to drop a program voltage $V'_{PP}$ applied to the memory cells as compared with that $V_{PP}$ applied to the monitor cells, in order to further accelerate the deterioration of the monitor cells as compared with the deterioration of the memory cells. In this embodiment, therefore, it is possible to more reliably monitor the progress of the deterioration of the monitor cells before the memory cells deteriorate.

As described above, according to the embodiments of the non-volatile memory device of the present invention, it is possible to externally and automatically check the presence of a margin of the number of data writable/erasable operations or activations in the monitor cells 13a and 13b. On the basis of the detection of the monitor cell margin, the margin of the memory cells arranged in the memory cell array 8 can be checked also externally and automatically.

What is claimed is:

1. A non-volatile memory device comprising:
    (a) memory cell array having a plurality of transistor memory cells arranged in an array, each memory cell comprising a transistor, data being written in and erasable from each memory cell by applying predetermined voltages to a control gate and a drain thereof, respectively, and by further injecting and extracting electrons to and from a floating gate thereof;
    (b) a monitor cell array having first and second monitor cells provided with the same characteristics as those of the memory cells;
    (c) first means fir writing a data "0" and then a data "1" in the first monitor cell and a data "1" and them a data "0" in the second monitor cell of said monitor cell array, whenever a data is written in one of the memory cells of said memory cell array;
    (d) second means for applying a voltage $V_{th1}$ higher than a threshold sense level voltage $V_{th3}$ applied to the control gates of the memory cells to a control gate of the first monitor cell of said monitor cell array and a voltage $V_{th2}$ lower than the threshold sense level voltage $V_{th3}$ to a control gate of the second monitor cell of said monitor cell array, in response to a test mode signal externally input whenever a data is read from said memory cells; and
    (e) third means for discriminating whether there exists a margin in the number of data writable operations of the memory cells by detecting deterioration in either of said monitor cells by observing an on state and off state of the first and second monitor cells, when the voltages $V_{th1}$ and $V_{th2}$ are respectively applied to the control gates of the first and second monitor cells of the said monitor cell array by said second means.

2. The non-volatile memory device of claim 1, wherein said second means comprises first plural series-connected resistors for generating three threshold voltages by dividing a supply voltage therethrough.

3. The non-volatile memory device of claim 2, wherein said second means further comprises second plural series-connected resistors and switching means connected in parallel to said first plural series-connected resistors, respectively, for generating three other threshold voltages by dividing the supply voltage by the first and second series-connected resistors connected in parallel to each other, respectively, when said switching means are turned on.

4. The non-volatile memory device of claim 1, which further comprises a voltage attenuator for applying to the memory cells a program voltage lower than the voltage applied to the monitor cells.

* * * * *